(12) United States Patent
Goshima

(10) Patent No.: US 6,300,771 B1
(45) Date of Patent: *Oct. 9, 2001

(54) ELECTRICAL INSPECTION DEVICE FOR DETECTING A LATENT DEFECT

(75) Inventor: Tsutomu Goshima, Toyama (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,674

(22) Filed: Nov. 23, 1998

(30) Foreign Application Priority Data

Nov. 28, 1997 (JP) ..................................... 9-327931

(51) Int. Cl.$^7$ ..................................... G01R 31/02
(52) U.S. Cl. ............................................. 324/550
(58) Field of Search ................... 324/550, 713, 324/549, 705, 537

(56) References Cited

U.S. PATENT DOCUMENTS 5,453,696 * 9/1995 Becker et al. ..................... 324/550
5,502,395 * 3/1996 Allen ................................. 324/713
5,525,909 * 6/1996 McCollum ........................ 324/550

FOREIGN PATENT DOCUMENTS

| 60-102707 | 6/1985 | (JP) . |
| 62-211568 | 9/1987 | (JP) . |
| 7-146327 | 6/1995 | (JP) . |
| 9-230002 | 9/1997 | (JP) . |

* cited by examiner

Primary Examiner—Safet Metjahic
Assistant Examiner—J Kerveros
(74) Attorney, Agent, or Firm—McGuireWoods, LLP

(57) ABSTRACT

An electric inspection device impresses between a pair of terminals a current pulse train having a constant pitch, a constant pulse width and a constant current, and measures the resistance appearing between the terminals based on the voltage appearing between the terminals. The variation of the resistance measured for the current pulses is compared against a threshold. If there is any latent defect in the circuit, such as latent open-circuit or short-circuit failure resides which is not in effect at present, a large variation of resistance is observed.

25 Claims, 4 Drawing Sheets

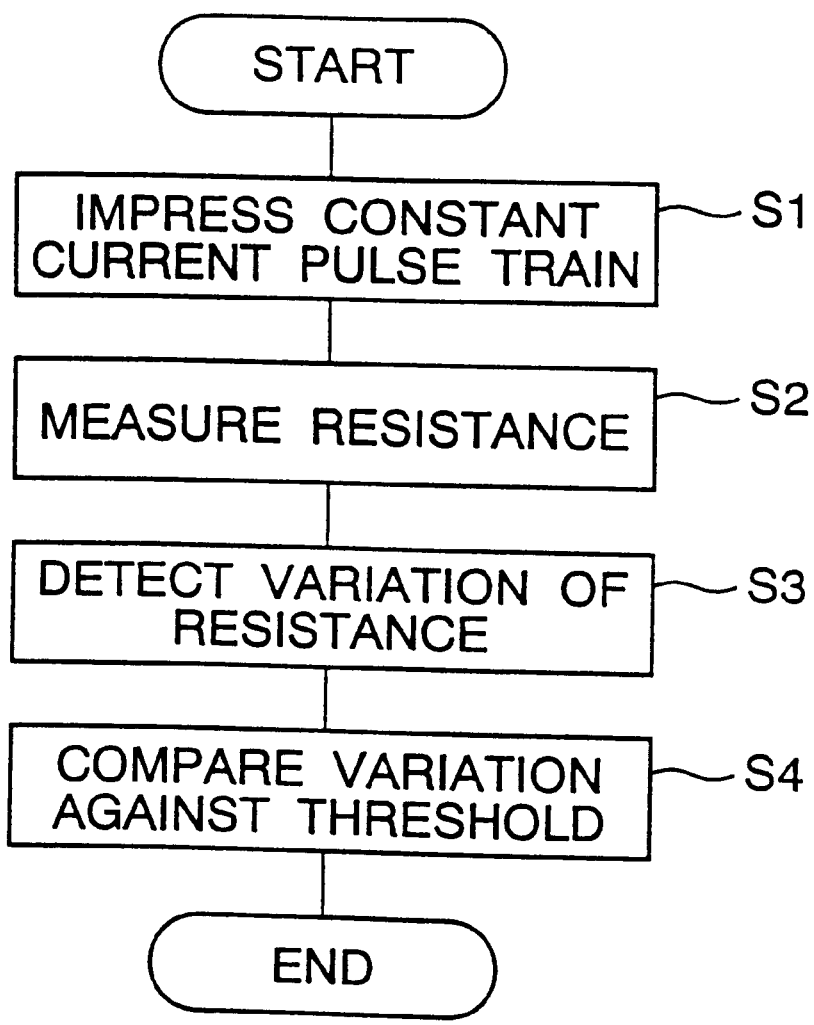

ELECTRICAL INSPECTION DEVICE FOR DETECTING A LATENT DEFECT

BACKGROUND OF THE INVENTION (a) Field of the Invention

The present invention relates to an electrical inspection device for detecting a latent defect and, more particularly, to an electrical inspection device for effectively detecting a latent defect in a printed circuit board etc. The present invention also relates to a method for electrically inspecting a printed circuit board etc. against such a failure.

(b) Description of the Related Art

In general, a printed circuit board may have an open-circuit failure in an interconnect or a short-circuit failure between interconnects caused by fabrication steps such as mounting a semiconductor chip on the printed circuit board, which necessitates an electrical inspection of the printed circuit board to confirm the absence of these defects.

The printed circuit board generally has defects such as a pseudo ON-state (or a latent open-circuit failure: a defect in an apparent normal ON-state that results in an open-circuit failure upon application of only a small mechanical, thermal or electrical stress) or a pseudo insulated state (a defect in an apparent normal insulated state that results in a short-circuit failure upon application of only a small mechanical, thermal or electrical stress) in a printed circuit board. In the text to follow, both the failures are referred to as "loose contacts".

A conventional electrical inspection of a printed circuit board is executed by using an electrical inspection device such as shown in FIG. 1.

The conventional electrical inspection device 40 includes a test block 41 having a current source 411 for generating a specified constant current and a measurement block 412 for allowing the constant current, supplied from the current generator section 411, to impress upon an interconnect 21 between subject terminals 22a and 22b by using probes 23a and 23b so as to detect the resistance component involved between the terminals 22a and 22b after measuring the voltage between the terminals 22a and 22b. The inspection device also has a comparator block 42 for detecting a ON or OFF state of the interconnect 21 in the printed circuit board based on the measured resistance component of the interconnect 21.

JP-A-60(1985)-102707 proposes a method for detecting a loose contact in a thin film interconnect, by applying a moderate pulse voltage having a specific pulse width and detecting a defect from the disturbance in the measured current wave.

In the conventional electrical inspection method, the loose contact cannot be effectively detected in a printed circuit board even when the loose contact resides in the interconnect.

Especially in the electrical inspection method proposed in JP-A-60-102707, there is a problem in that it is difficult to determine what kind of disturbance in the current wave falls within a defect to be detected as a loose contact.

SUMMARY OF THE INVENTION

It is therefore an object of the present invention to provide an electrical inspection device for use in a printed circuit board which is capable of effectively detecting a loose contact in the printed circuit board. It is another object of the present invention to provide a method for electrical inspection of a printed circuit board.

The present invention provides an electrical inspection device for inspecting a defect in an electric circuit comprising a pulse generator for generating a pulse train including a plurality of current pulses each having a specified current, a measurement block for impressing the pulse train between a pair of subject terminals and measuring a voltage appearing across the pair of subject terminals for each of the current pulses, a variation detector for detecting variation of resistance appearing between the pair of subject terminals based on the current of current pulses and the voltage measured for each current pulse, and a comparator block for comparing the variation against a threshold.

The present invention provides a method for electrically inspecting a defect in an electric circuit comprising the steps of impressing between a pair of subject terminals a pulse train including a plurality of current pulses each having a specified current, measuring a voltage appearing across the pair of subject terminals for each of the current pulses, detecting variation of resistance appearing between the pair of subject terminals based on the current of current pulse and the voltage measured for each current pulse, and comparing the variation against a threshold to detect a defect in the circuit.

In accordance with the present invention, a loose contact can be effectively detected which provides a significant variation in the resistance measured for each current pulse between the subject terminals.

BRIEF DESCRIPTION OF DRAWINGS

FIG. 5 is a flow chart of the processing in the printed circuit board of FIG. 2.

PREFERRED EMBODIMENTS OF THE INVENTION

Now, the present invention is more specifically described with reference to accompanying drawings.

Figure 1:
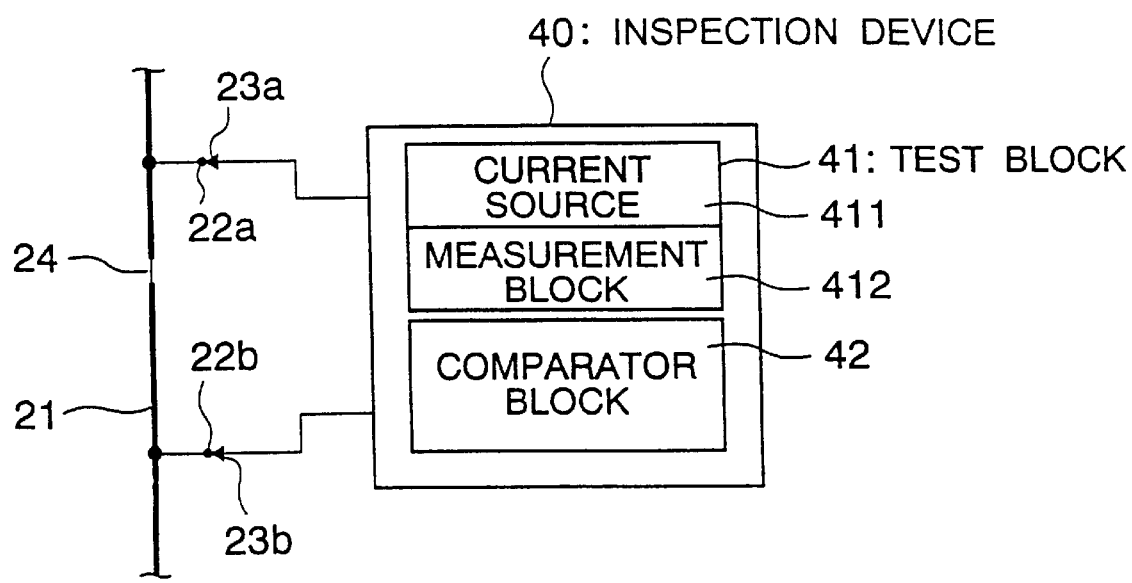
FIG. 1 is a block diagram of a conventional electrical inspection device for a printed circuit board.
Figure 2:
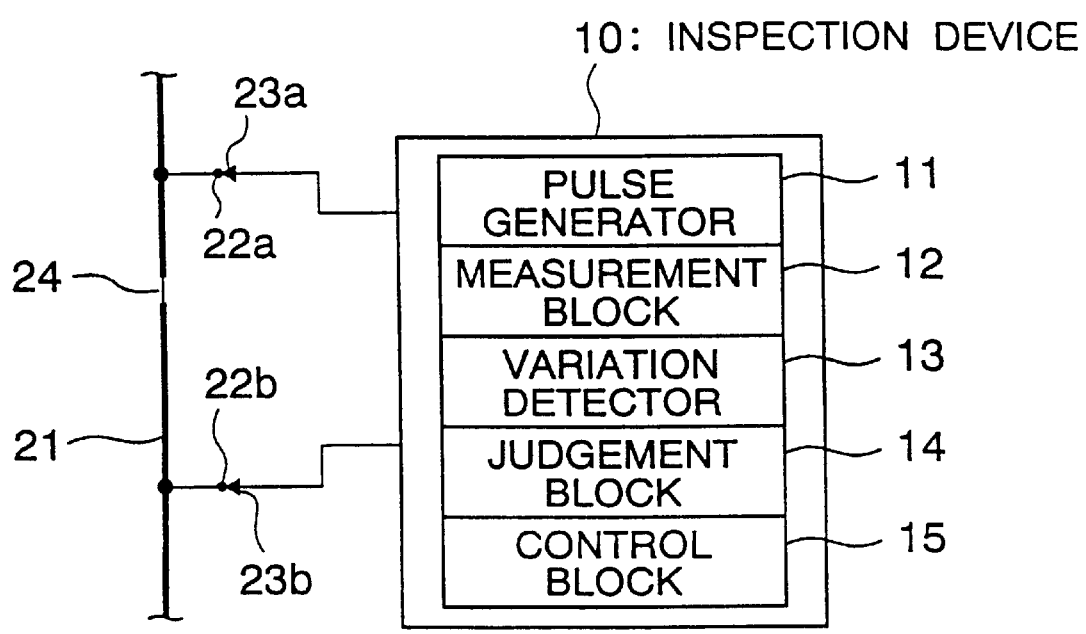
FIG. 2 is a block diagram of an electrical inspection device for a printed circuit board according to an embodiment of the present invention.

Referring to FIG. 2, an electrical inspection device, generally designated by 10, according to an embodiment of the present invention includes a pulse generator 11, a measurement block 12, a variation detector 13, a judgment block 14 and a control block 15.

The pulse generator 11 generates a current pulse train including a specified number (n) of constant current pulses generated during a specified time interval. Each current pulse has a constant current and a constant pulse width. The current pulse train is impressed upon a printed circuit board interconnect 21 to be inspected between terminals 22a and 22b thereof through probes 23a and 23b of the inspection device 10. The measurement block 12 measures the voltage across terminals 22a and 22b at the timing of each current pulse to calculate the resistance between the terminals 22a and 22b based on the measured voltage and the current of the constant current pulses. The variation detector 13 detects the variation $\Delta R(k)$ of resistance between terminals 22a and 22b where $\Delta R(k)=R(k)-R(k-1)$, provided that $R(i)$ represents the resistance measured at i-th current pulse, $1 \leq i \leq n$ and $2 \leq k \leq n$.

The judgement block 14 compares the variation $\Delta R(k)$ detected for each k-th current pulse by the variation detector 13 against a specified threshold to thereby judge whether or not the variation $\Delta R(k)$ exceeds an allowable value. The control block 15 controls the interval or frequency of the constant current pulse impressed upon the interconnect between terminals 22a and 22b.

In operation of the electrical inspection device 10 of the present embodiment, the control block 15 controls the number (n) of current pulses in the current pulse train impressed between terminals 22a and 22b. During the impression, the voltage across terminals 22a and 22b is measured for each current pulse by the measurement block 12 to determine the resistance between terminals 22a and 22b based on the measured voltage and the current of the current pulses. The variation detector 13 detects the variation $\Delta R(k)$ of resistance such that $\Delta R(k)=R(k)-R(k-1)$ for k-th current pulse where $2 \leq k \leq n$. The judgement block 14 compares the variation $\Delta R(k)$ against the threshold for judgment as to whether there is any defect in the interconnect 21.

Specifically, if the variation $\Delta R(k)$ is less than the threshold for all of the n current pulses, the interconnect 21 under test is judged to be normal, whereas if the variation $\Delta R(k)$ exceeds the threshold for any of the n current pulses, the interconnect 21 is judged to have a failure. After the impression of the specified number of current pulses, each result of judgment is stored in a memory device provided in the control block 15 together with other necessary and related information such as the lot number and the serial number of the printed circuit board under test and the locational identification of the interconnect in the printed circuit board. The electrical inspection is executed to all the subject interconnects in the printed circuit board under test.

In the inspection by the electrical inspection device 10, if there exists a complete insulation, such as a normal insulation or a failed open-circuit or disconnection, between terminals under test, a protective circuit operates to cut off the terminals from the pulse generator when the impressed voltage appearing between the subject terminals reaches to a specified value. In this case, the voltage impressed between terminals returns to zero and the inspection device indicates an "overflow".

Figure 3:
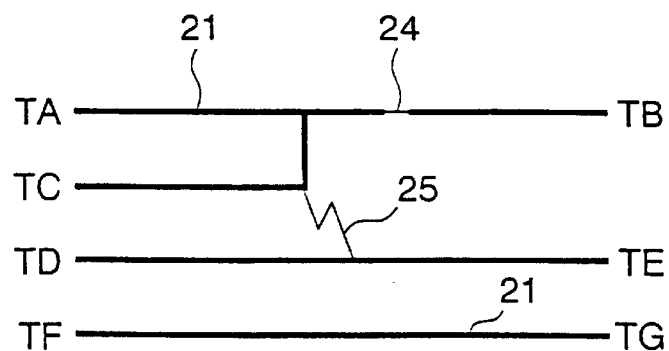
FIG. 3 is a schematic top plan view of interconnects in a printed circuit board under inspection.

Referring to FIG. 3, a practical example of a printed circuit board under test has interconnects for connecting terminals "TA" to "TG". In the inspection to follow for detecting presence or absence of a loose contact, the current of the current pulses is assumed constant. In the figure, the interconnect connecting terminals TA and TC with terminal TB has a first loose contact as a latent open-circuit failure, whereas a second loose contact 25 exists as a latent short-circuit failure between the interconnect connecting terminals TC with terminals TA and TB and the interconnect connecting terminal TD with terminal TE.

Figure 4A:
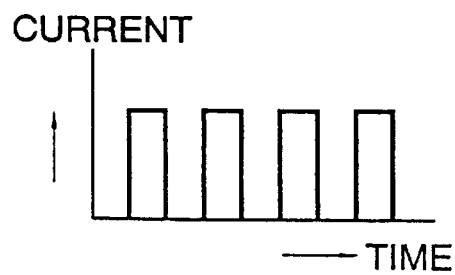
FIGS. 4A to 4D are signal timing charts in the electrical inspection device of FIG. 2.
Figure 4B:
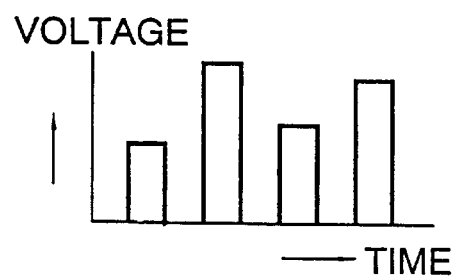
Figure 4C:
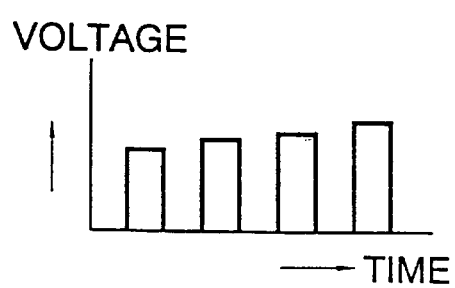
Figure 4D:
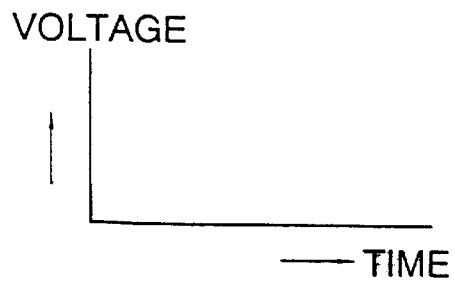

Referring to FIGS. 4A to 4D, there is shown a current pulse train and typical voltage signals detected by the inspection device. FIG. 4A shows the current pulse train impressed between terminals, FIG. 4B shows the output voltage in case of the presence of a loose contact, FIG. 4C shows the output voltage in case of the presence of a short-circuit failure or a normal connection, and FIG. 4D shows the output voltage in case of the presence of an open-circuit failure or a normal insulation.

In the inspection executed between terminals TD and TE, an output voltage such as shown in FIG. 4C results, wherein the resistance between terminals TD and TE rises moderately within a range of several percentages, which is well below the threshold (20%) in this embodiment. As a result, the interconnect connecting between terminals TD and TE is judged normal. The moderate change of resistance is due to the joule heat generated in the interconnect.

In the inspection executed between terminals TD and TF or terminals TE and TG, an output voltage such as shown in FIG. 4D results, wherein the output voltage remains at zero at any instance. The resistance supplied to the variation detector 13 exceeds the indicator, as a result of which the variation is not measured and thus treated as having no variation. In this case, it is noted that there is no interconnect connecting terminals TD and TF or terminals TE and TG together, as a result of which the case of a complete open-circuit failure is excluded In the inspection executed between terminal TA or TC and terminal TB, or between terminal TA, TB or TC and terminal TD or TE, which involve therebetween a loose contact, an output voltage such as shown in FIG. 4B results. In this case, the resistance measured between the terminals having latent defect therebetween exhibits significant variations due to the current pulses. That is, the output voltage measured between terminals changes significantly as shown in FIG. 4B, exhibiting a presence of a loose contact between the terminals.

In the above inspection, the measured voltage provides a direct parameter for showing the absence or presence of the defect because variation of the output voltage is equivalent to the variation of resistance, which renders calculation of the resistance unnecessary. On the other hand, if the resistance of the printed interconnect is to be calculated for every current pulse, it is possible to change the current of the current pulses in the pulse train to judge the printed interconnect normal or abnormal.

Referring to FIG. 5, an electrical inspection method for a printed circuit board according to an embodiment of the present invention has first through fourth steps S1 to S4 for examining whether or not a loose contact is present in a printed circuit board.

First step S1 includes impressing of constant current pulses, which has a constant current, constant pulse width and a constant pulse pitch, between subject terminals for a specified number (n) of times. Second step S2 includes measuring the resistance between the subject terminals based on the current of each constant current pulse and the voltage appearing between the measured terminals for the each current pulse. Third step S3 includes detecting variation $R(k)$ in the resistance such that $\Delta R(k)=R(k)-R(k-1)$. Fourth step S4 includes judgement as to whether there is any open- or short-circuit failure by comparing the variation $\Delta R(k)$ against a threshold (20%, for example) and storing the result of the judgement.

More specifically, with reference to FIG. 2 additionally to FIG. 5, a pair of subject terminals are selected, in step S1, based on an interconnect to be inspected, and a number (n) of current pulses having a specified current, pulse width and a pulse pitch are impressed between the pair of terminals.

In step S2, the voltage appearing between the pair of subject terminals is measured by the measurement block 12 for every current pulse to calculate the resistance (including pseudo resistance) based on the measured voltage and the current of the current pulses. The resistance between the subject terminals is expressed herein by $R(i)$ for i-th current pulse where $1 \leq i \leq n$.

In step S3, variation $\Delta R(k)=R(k-R(k-1)$ for the resistance $R(k)$ between the subject terminals is calculated based on the calculated $R(i)$.

In step S4, a presence or absence of a loose contact is obtained by comparing the variation $\Delta R(k)$ against a threshold. The result of the judgment together with information relating to the subject printed board, such as the lot number and the serial number of the printed circuit board, and the locational identification of the interconnect is stored in a memory.

As mentioned above, the electrical inspection according to the present embodiment facilitates detection of a loose contact in a printed circuit board.

Now, results of the experiments using the electrical inspection method of the present embodiment will be shown.

Samples of the printed circuit board shown in FIG. 3 were prepared, each of which had first and second loose contacts 24 and 25. The rating of interconnects was 0.5 amperes. The pulse trains used in the inspection included four different pulse widths Pt and four different pulse currents PA, as shown in Table 1. The pitch of the pulses in each pulse train was twice the pulse width Pt for the each pulse train. The ratio of the number of detected latent defects to the number of the existing latent defects was examined in the experiment for each combination of the pulse width Pt and the pulse current PA, the results of which are shown in Table 1. In the experiments, the number of samples was 20, the number of pulses in each pulse train was 10, and the threshold used for the variation of resistance was selected at 20%.

TABLE 1

| | Ratio of Detecting Latent Defect (%) | | | |
| --- | --- | --- | --- | --- |
| | Pt | | | |
| PA | 5 ms | 10 ms | 15 ms | 20 ms |
| 0.5 A | 5 | 30 | 45 | 60 |
| 1.0 A | 45 | 70 | 100 | 100 |
| 1.5 A | 60 | 100 | 100 | 100 |
| 2.0 A | 85 | 100 | 100 | 100 |

From the results shown above, it is preferable that the current of current pulses be 1.0 A, which is twice the circuit ratings of the interconnects, and the pulse width be 15 ms or more, for accurately detecting the existing loose contact. Number of pulses in the pulse train may be two or more, more preferably five or more. The current of the current pulses is preferably between 1.5 and 4 folds of the rating of the interconnects. The threshold for the variation may be preferably between 0.15 and 0.3 of the resistance measured for the preceding current pulses.

Since the above embodiments are described only for examples, the present invention is not limited to the above embodiments and various modifications or alterations can be easily made therefrom by those skilled in the art without departing from the scope of the present invention.

What is claimed is:

1. An electrical inspection device for inspecting a defect in an electric circuit, comprising:
    a pulse generator for generating a pulse train including a plurality of current pulses each having a specified current,
    a measurement block for impressing said pulse train between a pair of subject terminals and measuring a voltage appearing across said pair of subject terminals for each of said current pulses,
    a variation detector for detecting variation of resistance from a previous current pulse of said pulse train appearing between said pair of subject terminals based on said current of current pulses and said voltage measured for each of the current pulses, and
    a comparator block for comparing said variation of resistance against a threshold value related to a variation in resistance expected from joule heating by said pulse train.

2. The electrical inspection device as defined in claim 1, wherein said current pulses are generated at a constant pitch.

3. The electrical inspection device as defined in claim 1, wherein current of said pulse train is constant.

4. The electrical inspection device as defined in claim 1, wherein said current pulses have a constant pulse width.

5. The electrical inspection device as defined in claim 1, wherein said current of said current pulse is between 1.5 and 4.0 folds of rating of said interconnect.

6. The electrical inspection device as defined in claim 1, wherein said threshold is between 0.15% and 0.30% of resistance measured for preceding current pulses.

7. The electrical inspection device as defined in claim 1, wherein said electric circuit is formed in a printed circuit board.

8. The electrical inspection device as defined in claim 1, wherein said comparator block compares said variation of resistance against a threshold to determine whether a loose contact exists in said electric circuit.

9. The electric inspection device as defined in claim 8, further comprising:
    a memory for storing a result of said comparator block as to whether said electric circuit has a loose contact.

10. The electrical inspection device as defined in claim 9, wherein said variation of resistance is detected as a difference between voltages produced by two consecutive current pulses impressed between said subject terminals.

11. The electrical inspection device as defined in claim 1, wherein said variation of resistance is detected by the variation detector as a difference between voltages produced by at least two of said current pulses impressed by said pulse generator between said subject terminals.

12. The electric inspection device as defined in claim 11, wherein said memory stores said result along with at least one of a lot number or serial number of said electric circuit and a locational identification an interconnect containing the electric circuit.

13. A method for electrically inspecting a defect in an electric circuit, comprising the steps of:
    impressing between a pair of subject terminals a pulse train including a plurality of current pulses each having a specified current,
    measuring a voltage appearing across said pair of subject terminals for each of said current pulses,
    detecting a variation of resistance related to a variation in resistance expected from joule heating by said pulse train appearing between said pair of subject terminals based on said current of current pulses and said voltage measured to detect variation of resistance during a current pulse from a previous current pulse by comparison against a threshold value.

14. The method as defined in claim 13, wherein said current pulses are generated at a constant pitch.

15. The method as defined in claim 13, wherein current of said pulse train is constant.

16. The method as defined in claim 13, wherein said current pulses have a constant pulse width.

17. The method as defined in claim 13, wherein said current of said current pulse is between 1.5 and 4.0 folds of rating of said interconnect.

18. The method as defined in claim 13, wherein said threshold is between 0.15% and 0.30% of resistance measured for preceding current pulses.

19. The method as defined in claim 13, wherein said electric circuit is formed in a printed circuit board.

20. The method as defined in claim 13, wherein, in said detecting step, said variation of resistance is detected to detect presence or absence of a loose contact.

21. The method as defined in claim 20, further comprising:

storing, in a memory, a result of said comparing step as to whether said electric circuit has a loose contact.

22. The method as defined in claim 21, storing said result along with at least one of a lot number or serial number of said electric circuit and a locational identification an interconnect containing the electric circuit.

23. The method as defined in claim 13, wherein said variation of resistance is detected as a difference between voltages produced by at least two of said current pulses impressed by said pulse generator between said subject terminals.

24. The method as defined in claim 23, wherein said variation of resistance is detected as a difference between voltages produced by two consecutive current pulses impressed between said subject terminals.

25. A method for detecting a defect in a circuit of a printed circuit board, comprising:

inputting a train of current pulses between two terminals of said printed circuit board;

measuring resistance values produced by respective ones of said train of current pulses;

calculating a difference between at least two of said resistance values as produced by two of said current pulses;

comparing said difference to a predetermined threshold value related to a variation in resistance expected from joule heating by said pulse train; and identifying a defect as existing between said terminals based on said comparing step.

\* \* \* \* \*